(12) United States Patent
Li et al.

(10) Patent No.: US 12,446,446 B2
(45) Date of Patent: Oct. 14, 2025

(54) DISPLAY PANEL AND MANUFACTURING METHOD THEREOF WITH OPTICAL LAYERS OF DIFFERENT REFRACTIVE INDEXES

(71) Applicant: Shenzhen China Star Optoelectronics Semiconductor Display Technology Co., Ltd., Guangdong (CN)

(72) Inventors: Yiwen Li, Guangdong (CN); Zhiyuan Yin, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 417 days.

(21) Appl. No.: 18/129,513

(22) Filed: Mar. 31, 2023

(65) Prior Publication Data

US 2024/0215407 A1 Jun. 27, 2024

(30) Foreign Application Priority Data

Dec. 22, 2022 (CN) .......................... 202211658548.6

(51) Int. Cl.
*H10K 59/80* (2023.01)
*H10K 71/00* (2023.01)

(52) U.S. Cl.
CPC ........... *H10K 59/879* (2023.02); *H10K 71/00* (2023.02)

(58) Field of Classification Search
CPC ................. H10K 59/879; H10K 71/00; H10K 2102/351; H10K 50/858; H10K 59/38
See application file for complete search history.

(56) References Cited

U.S. PATENT DOCUMENTS

2011/0140139 A1 6/2011 Jeong et al.
2018/0108869 A1 4/2018 Maeda
(Continued)

FOREIGN PATENT DOCUMENTS

CN 104752475 A 7/2015
CN 109285866 A 1/2019
(Continued)

OTHER PUBLICATIONS

Kamada, Yudai, et al. "Study on oxygen source and its effect on film properties of zno deposited by radio frequency magnetron sputtering." Applied Surface Science, vol. 258, No. 2, Nov. 2011, pp. 695-699, https://doi.org/10.1016/j.apsusc.2011.07.100. (Year: 2011).*
(Continued)

*Primary Examiner* — J. E. Schoenholtz
(74) *Attorney, Agent, or Firm* — PV IP PC; Wei Te Chung

(57) ABSTRACT

An embodiment of the present invention discloses a display panel and a manufacturing method thereof. The display panel includes a substrate, a light emitting functional layer, a first electrode layer, and an optical adjustment layer. The light emitting functional layer includes a plurality of light emitting units of different light emitting colors. The optical adjustment layer includes a semiconductor oxide. The optical adjustment layer at least comprises a first optical layer and a second optical layer. A light emitting color of the light emitting units corresponding to the first optical layer is different from a light emitting color of the light emitting units corresponding to the second optical layer. A refractive index of at least one film layer of the first optical layer is different from a refractive index of at least one film layer of the second optical layer.

14 Claims, 6 Drawing Sheets

(56) References Cited

U.S. PATENT DOCUMENTS

2020/0203662 A1\* 6/2020 Mollard ............... H10K 59/876
2020/0411798 A1 12/2020 Kristal

FOREIGN PATENT DOCUMENTS

| | | | |
|---|---|---|---|
| CN | 110299472 | A | 10/2019 |
| CN | 110462870 | A | 11/2019 |
| CN | 110491923 | A | 11/2019 |
| CN | 114068845 | A | 2/2022 |
| JP | 2004335207 | A | 11/2004 |
| JP | 2007026852 | A | 2/2007 |
| JP | 2009099502 | A | 5/2009 |
| JP | 2009181856 | A | 8/2009 |
| JP | 2012186083 | A | 9/2012 |
| JP | 2013206567 | A | 10/2013 |
| JP | 2015002087 | A | 1/2015 |
| JP | 2018088365 | A | 6/2018 |
| JP | 2020126828 | A | 8/2020 |
| WO | 2022209588 | A1 | 10/2022 |

OTHER PUBLICATIONS

Camacho-López, M A. "Characterization of nanostructured SnO2 films deposited by reactive DC-magnetron sputtering." Superficies y Vacío, vol. 26, No. 3, Sep. 3, 2013, pp. 95-99. (Year: 2013).\*
Chinese Office Action issued in corresponding Chinese Patent Application No. 202211658548.6 dated Jul. 16, 2024, pp. 1-11.
Japanese Office Action issued in corresponding Japanese Patent Application No. 特願2023-216242 dated Jan. 28, 2025, pp. 1-4.

\* cited by examiner

DISPLAY PANEL AND MANUFACTURING METHOD THEREOF WITH OPTICAL LAYERS OF DIFFERENT REFRACTIVE INDEXES

FIELD OF INVENTION

The present invention relates to a field of displays, especially to a display panel and a manufacturing method thereof.

BACKGROUND OF INVENTION

In recent years, organic light emitting diode (OLED) display panels have advantages such as wide gamut, fast response, high contrast, simple structure, and light weight, and therefore are loved by consumer. In an OLED structure, transparent conductive oxide (TCO) material is applied extensively to OLED display panels due to high conductivity, high transmittance, and appropriate work function, and performs functions of planarizing topography, protect electrode metal, and compensating an optical thickness. An common formation method for TCO material is magnetron sputtering. Generally, TCO thin films of different properties or types require multiple apparatuses. Therefore, a TCO thin film applied to a reflection electrode is usually made of a single ingredient, properties and film thickness of a TCO thin film corresponding to a light emitting unit of each color are the same, and an optimization cost of pixels of different light emitting colors is higher.

Therefore, a display panel and a manufacturing method thereof are urgently required to solve the above technical issue.

SUMMARY OF INVENTION

The present invention provides a display panel and a manufacturing method thereof that can ease a technical issue of a higher optimization cost of pixels of different light emitting colors.

The present invention provides a display panel, comprising:
 a substrate;
 a first electrode layer located on the substrate;
 an optical adjustment layer located on the first electrode layer, wherein the optical adjustment layer comprises a semiconductor oxide;
 a light emitting functional layer located on the optical adjustment layer, wherein the light emitting functional layer comprises a plurality of light emitting units of different light emitting colors;
 wherein the optical adjustment layer comprises a first optical layer and a second optical layer, the first optical layer corresponds to the light emitting units of a light emitting color, the second optical layer corresponds to the light emitting units of another light emitting color, and a refractive index of at least one film layer of the first optical layer is different from a refractive index of at least one film layer of the second optical layer.

In some embodiments, at least one of the first optical layer comprises a first sublayer and a second sublayer disposed adjacent to each other, and the second sublayer is located between the first sublayer and the light emitting functional layer; and a refractive index of the second sublayer is greater than a refractive index of the first sublayer.

In some embodiments, the light emitting functional layer comprises a first organic sublayer located on a surface of a side of the second sublayer away from the substrate, and the refractive index of the second sublayer is greater than a refractive index of the first organic sublayer.

In some embodiments, at least one of the first optical layer comprises a first sublayer, a second sublayer located on a side of the first sublayer near the light emitting functional layer, and a third sublayer located between the second sublayer and the light emitting functional layer; and the refractive index of the second sublayer is less than the refractive index of the first sublayer, and the refractive index of the second sublayer is less than the refractive index of the third sublayer.

In some embodiments, the light emitting functional layer comprises a first organic sublayer located on a surface of a side of the third sublayer away from the substrate, and the refractive index of the third sublayer is greater than a refractive index of the first organic sublayer.

In some embodiments, a number of the at least one film layer of the first optical layer is greater than a number of the at least one film layer of the second optical layer, and a wavelength of a color light corresponding to the first optical layer is greater than a wavelength of a color light corresponding to the second optical layer.

In some embodiments, a thickness of the first optical layer is greater than a thickness of the second optical layer.

In some embodiments, the display panel further comprises: a second electrode layer located on a side of the light emitting functional layer away from the first electrode layer; and a light extraction layer located on a side of the second electrode layer away from the light emitting functional layer, wherein the light extraction layer comprises a semiconductor oxide; wherein the light extraction layer comprises a first extraction layer corresponding to the light emitting units of a light emitting color and a second extraction layer corresponding to the light emitting units of another light emitting color, and a refractive index of at least one film layer of the first extraction layer is different from a refractive index of at least one film layer of the second extraction layer.

In some embodiments, the first extraction layer comprises a first extraction sublayer and a second extraction sublayer, the first extraction sublayer is a film layer of the first extraction layer most away from the light emitting units, and the second extraction sublayer is disposed on a surface of a side of the first extraction sublayer near the second electrode layer; and a refractive index of the first extraction sublayer is greater than a refractive index of the second extraction sublayer.

In some embodiments, the optical adjustment layer further comprises third optical layer, the refractive index of at least one film layer of the first optical layer, the refractive index of at least one film layer of the second optical layer, and a refractive index of at least one film layer of the third optical layer are different, and light emitting colors of the light emitting units corresponding to the first optical layer, the second optical layer, and the third optical layer are different.

In some embodiments, a thickness of the first optical layer is greater than a thickness of the second optical layer, a thickness of the second optical layer is greater than a thickness of the third optical layer; a number of the at least one film layer of the first optical layer is greater than a number of the at least one film layer of the second optical layer, and the number of the at least one film layer of the second optical layer is greater than a number of the at least one film layer of the third optical layer; and a wavelength of a color light corresponding to the first optical layer is greater than a wavelength of a color light corresponding to the second optical layer, and a wavelength of a color light corresponding to the second optical layer is greater than a wavelength of a color light corresponding to the third optical layer.

The present invention further comprises a display panel manufacturing method, comprising:

providing a first electrode layer;

adding oxygen in a process gas by a magnetron sputtering technology, and forming at least a first optical layer and a second optical layer on the first electrode layer by semiconductor oxide material, wherein a refractive index of at least one film layer of the first optical layer is different from a refractive index of at least one film layer of the second optical layer to form an optical adjustment layer; and forming a plurality of light emitting units including different light emitting colors on a side of the optical adjustment layer away from the first electrode layer, wherein the first optical layer corresponds to the light emitting units of a light emitting color and the second optical layer corresponds to the light emitting units of another light emitting color to form a light emitting functional layer.

Advantages of the present invention: The present invention, during magnetron sputtering film formation, adjusts oxygen content in a process gas, adjusts a crystalline form of semiconductor material, and adjusts a refractive index of a film layer in an optical adjustment layer to adapt for optical demands of light emitting units of different light emitting colors to improve display effects of pixels of different light emitting colors.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DETAILED DESCRIPTION OF PREFERRED EMBODIMENTS

Figure 1:
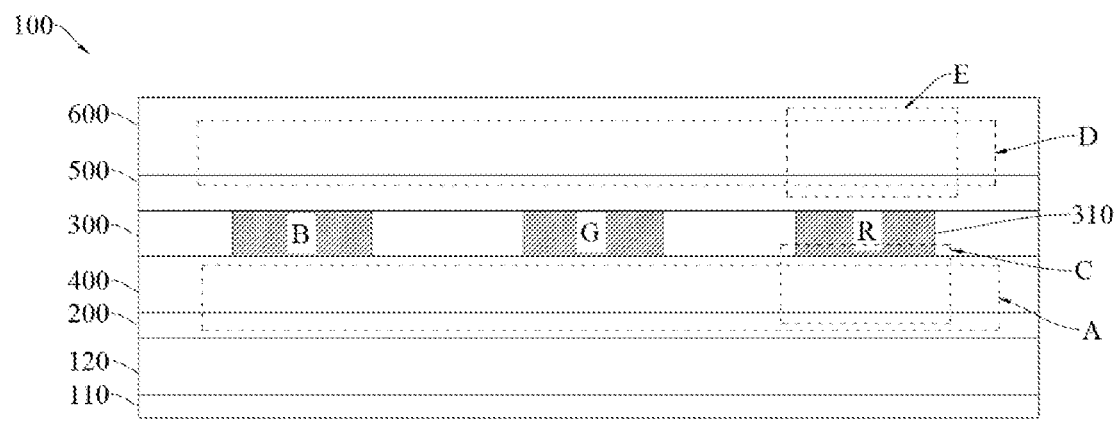
FIG. 1 is a schematic structural view of a display panel provided by an embodiment of the present invention.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when not specified to the contrary explanation, usually refer to the upper and lower states of the device in actual use or working conditions, specifically according to the direction of the figures in the drawings. Furthermore, "inner" and "outer" refer to the outline of the device.

In recent years, organic light emitting diode (OLED) display panels have advantages such as wide gamut, fast response, high contrast, simple structure, and light weight, and therefore are loved by consumer. In an OLED structure, transparent conductive oxide (TCO) material is applied extensively to OLED display panels due to high conductivity, high transmittance, and appropriate work function, and performs functions of planarizing topography, protect electrode metal, and compensating an optical thickness. An common formation method for TCO material is magnetron sputtering. Generally, TCO thin films of different properties or types require multiple apparatuses. Therefore, a TCO thin film applied to a reflection electrode is usually made of a single ingredient, properties and film thickness of a TCO thin film corresponding to a light emitting unit of each color are the same, and an optimization cost of pixels of different light emitting colors is higher.

With reference to FIGS. 1 to 8, the embodiment of the present invention provides a display panel 100, comprising:

a substrate 110;

a first electrode layer 200 located on the substrate 110;

an optical adjustment layer 400 located on the first electrode layer 200, wherein the optical adjustment layer 400 comprises a semiconductor oxide;

a light emitting functional layer 300 located on the optical adjustment layer 400, wherein the light emitting functional layer 300 comprises a plurality of light emitting units 310 of different light emitting colors;

wherein the optical adjustment layer 400 at least comprises a first optical layer 410 and a second optical layer 420, the first optical layer 410 corresponds to the light emitting units 310 of a light emitting color, the second optical layer 420 corresponds to the light emitting units 310 of another light emitting color, and a refractive index of at least one film layer of the first optical layer 410 is different from a refractive index of at least one film layer of the second optical layer 420.

The present invention, during magnetron sputtering film formation, adjusts oxygen content in a process gas, adjusts a crystalline form of semiconductor material, and adjusts a refractive index of a film layer in an optical adjustment layer to adapt for optical demands of light emitting units of different light emitting colors to improve display effects of pixels of different light emitting colors.

A technical solution of the present invention will be described in combination with specific embodiments.

Figure 2:
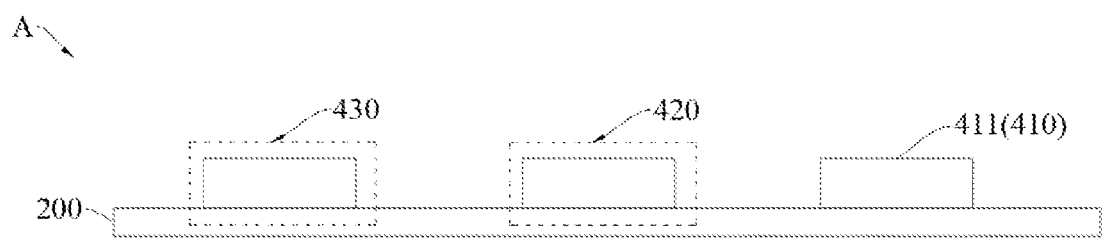
FIG. 2 is a first enlarged schematic view of a region A of FIG. 1.

In the present embodiment, with reference to FIGS. 1 and 2, the display panel 100 comprises a substrate 110, a first electrode layer 200, a light emitting functional layer 300, and an optical adjustment layer 400 located between the light emitting functional layer 300 and the first electrode layer 200. The light emitting functional layer 300 comprises a plurality of light emitting units 310 of different light emitting colors. The first electrode layer 200 is located on a light exiting side away from the light emitting functional layer 300. The optical adjustment layer 400 comprises a semiconductor oxide. The optical adjustment layer 400 at least comprises a first optical layer 410 and a second optical layer 420. A refractive index of at least one film layer of the first optical layer 410 is different from a refractive index of at least one film layer of the second optical layer 420. The first optical layer 410 is located between the light emitting units 310 of a light emitting color and the first electrode layer 200. The second optical layer 420 is located between the light emitting units 310 of another light emitting color and the first electrode layer 200. For example, the first optical layer 410 corresponds to the light emitting units 310 emitting red light, and the second optical layer 420 corresponds to the light emitting units 310 emitting green light. In the figure, R indicates light emitting units 310 of red light, G indicates light emitting units 310 of green light, and B indicates light emitting units 310 of blue light.

The display panel 100 further comprises a second electrode layer 500 located on a side of the light emitting functional layer 300 away from the first electrode layer 200. A cavity is formed between the first electrode layer 200 and the second electrode layer 500. By using a micro cavity effect, a light emitting rate and a light color purity of light can be raised. For example, a wavelength of red light is greater than a wavelength of green light, so an optical path of the red light is required to be greater than an optical path of the green light to increase a micro cavity effect of red light. During formation by a magnetron sputtering method, oxygen is added in a process gas, a crystalline form of semiconductor material is adjusted by adjusting oxygen content to adjust a refractive index of the film layer in the optical adjustment layer 400 to adapt for optical demands of light emitting units 310 of different light emitting colors, and improve a display effect of pixels of different light emitting colors. By a principle of an optical path in proportion to a refractive index of a film layer, for example, a refractive index of a film layer of optical adjustment layer 400 corresponding to the light emitting units 310 of red light increases to increase an optical path of the red light to improve a micro cavity effect of red light to enhance a light emitting rate and a light color purity.

In some embodiments, the light emitting functional layer 300 can also adjust a length of the micro cavity.

In some embodiments, the first electrode layer 200 is located on a light exiting side away from the light emitting functional layer 300. Material of the first electrode layer 200 has a reflection function and a conduction function. The first electrode layer 200 comprises any one of Ag, Al, Pt, Mo, Ti, Cu, Mg, and a combination thereof, and a thickness of the first electrode layer 200 ranges from 100 nm to 1000 nm.

In some embodiments, the light emitting functional layer 300 at least comprises a light emitting material layer, and can further comprise a hole injection layer, a hole transport layer, an electron transport layer, an electron injection layer, an electron barrier layer between the hole transport layer and the light emitting material layer, and a hole barrier layer between the light emitting material layer and the electron transport layer. The light emitting functional layer 300 can be manufactured by one or more of vacuum evaporation, spin coating, printing, physical deposition, and chemical deposition methods.

Figure 3:
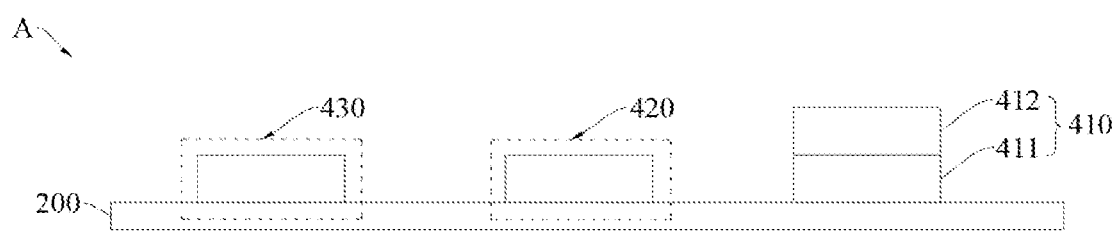
FIG. 3 is a second enlarged schematic view of the region A of FIG. 1.
Figure 4:
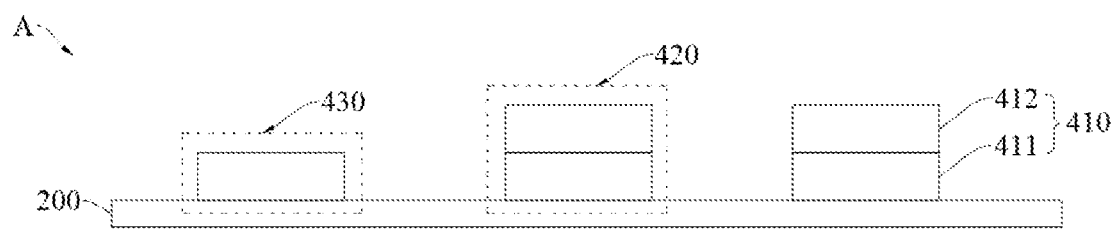
FIG. 4 is a third enlarged schematic view of the region A of FIG. 1.

In some embodiments, with reference to FIGS. 1, 3, and 4, at least one of the first optical layer 410 comprises at least two film layers, and refractive indexes of at least two film layers of the first optical layer 410 are different.

The first optical layer 410 comprises at least two film layers, and refractive indexes of at least two film layers of the first optical layer 410 are different. The two film layers of different refractive indexes are used to change optical properties of the first optical layer 410 according to different optical demands to achieve different optical effects and improve the display effect.

In some embodiments, with reference to FIGS. 1, 3, and 4, at least one of the first optical layer 410 comprises a first sublayer 411 and a second sublayer 412 disposed adjacently. A refractive index of the first sublayer 411 is different from a refractive index of the second sublayer 412.

The first sublayer 411 and the second sublayer 412 of different refractive indexes are disposed adjacently to more directly affect light, lower complicated influence of multiple film layers to light, reduce a calculation amount of designing a refractive index of a film layer, and more facilitate changing optical properties of the first optical layer 410 according to different optical demands to achieve different optical effects and improve the display effect.

In some embodiments, with reference to FIGS. 1, 3, and 4, the second sublayer 412 is located between the first sublayer 411 and the light emitting functional layer 300. The refractive index of the second sublayer 412 is greater than the refractive index of the first sublayer 411.

A direction from the first sublayer 411 to the second sublayer 412 is a direction of light emitted out from the display panel 100. The first sublayer 411 and the second sublayer 412 form a comparative low-high refractive index, which can raise a convergence degree of light to increase a light emitting efficiency of light and improve a display effect.

Figure 6:
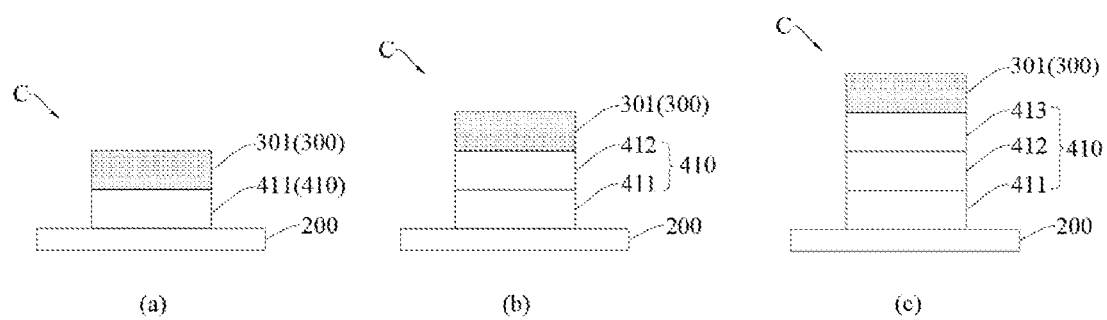
FIG. 6 is an enlarged schematic view of a region C of FIG. 1.

In some embodiments, with reference to FIG. 1 and FIG. 6 (b), the light emitting functional layer 300 at least comprises a first organic sublayer 301. The first organic sublayer 301 is located on a surface of a side of the second sublayer 412 away from the substrate 110. A refractive index of the second sublayer 412 is greater than a refractive index of the first organic sublayer 301. The refractive index of the second sublayer 412 is greater than a refractive index of a film layer of the light emitting functional layer 300 most near the second sublayer 412. The first sublayer 411, second sublayer 412, and first organic sublayer 301 in sequence form a comparative low-high-low refractive index. By using optical waveguide principle, light can perform movement of a multi-path in the second sublayer 412 to increase an optical path of light to combine a micro cavity effect, increase the light emitting rate and the light color purity, and the optical path of light increases while a thickness of the film layer decreases to lower a material cost.

In some embodiments, when the light emitting functional layer 300 comprises a light emitting material layer, the first organic sublayer 301 is the light emitting material layer. When the light emitting functional layer 300 comprises a light emitting material layer and an electron barrier layer, the first organic sublayer 301 is the electron barrier layer. When the light emitting functional layer 300 comprises a light emitting material layer, an electron barrier layer, and a hole transport layer, the first organic sublayer 301 is the hole transport layer. When the light emitting functional layer 300 comprises a light emitting material layer, an electron barrier layer, a hole transport layer, and a hole injection layer, the first organic sublayer 301 is the hole injection layer.

In some embodiments, according to different display demands, a difference between the refractive index of the second sublayer 412 and the refractive index of the first sublayer 411 and a difference between the refractive index of the second sublayer 412 and a refractive index of a film layer of the light emitting functional layer 300 most near the second sublayer 412 are adjusted to achieve different optical effects and improve the display effect.

In some embodiments, the second sublayer 412 is located between the first sublayer 411 and the light emitting functional layer 300. The refractive index of the second sublayer 412 is less than the refractive index of the first sublayer 411. The first sublayer 411 and the second sublayer 412 form a comparative high-low refractive index such that light has a diffusion effect, which can further improve a display viewing angle of light.

Figure 5:
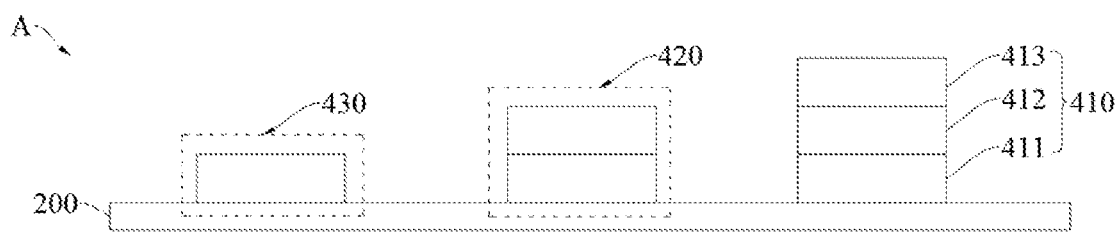
FIG. 5 is a fourth enlarged schematic view of the region A of FIG. 1.

In some embodiments, with reference to FIGS. 1 and 5, at least one of the first optical layer 410 comprises a first sublayer 411, a second sublayer 412 located on a side of the first sublayer 411 near the light emitting functional layer 300, and a third sublayer 413 located between the second sublayer 412 and the light emitting functional layer 300. The refractive index of the second sublayer 412 is less than the refractive index of the first sublayer 411, and the refractive index of the second sublayer 412 is less than a refractive index of the third sublayer 413.

The first sublayer 411, second sublayer 412, third sublayer 413 in sequence form a comparative high-low-high refractive index. When passing through the second sublayer 412 and the third sublayer 413, light passes from a film layer of a low refractive index to a film layer of a high refractive index, which can improve a convergence degree of light to enhance a light emitting efficiency of light and improve a display effect.

In some embodiments, with reference to FIG. 1 and FIG. 6 (c), the light emitting functional layer 300 at least comprises a first organic sublayer 301, and the first organic sublayer 301 is located on a surface of a side of the third sublayer 413 away from the substrate 110. The refractive index of the third sublayer 413 is greater than the refractive index of the first organic sublayer 301, and the refractive index of the third sublayer 413 is greater than a refractive index of a film layer of the light emitting functional layer 300 most near the third sublayer 413. The second sublayer 412, third sublayer 413, and first organic sublayer 301 in sequence form a comparative low-high-low refractive index. By using an optical waveguide principle, light can perform movement of a multi-path in the third sublayer 413 to increase an optical path of light to combine a micro cavity effect, increase the light emitting rate and the light color purity, and the optical path of light increases while a thickness of the film layer decreases to lower a material cost.

In some embodiments, the refractive index of the first sublayer 411 is different from the refractive index of the third sublayer 413. According to different optical demands, a difference between the refractive index of the first sublayer 411 and the refractive index of the third sublayer 413 is adjusted to achieve different optical effects and improve the display effect.

For example, the refractive index of the third sublayer 413 is greater than the refractive index of the first sublayer 411, which can increase a convergence degree of light and improve a light emitting rate. For example, the refractive index of the third sublayer 413 is less than the refractive index of the first sublayer 411, which can increase a diffusion degree of light and raise an initial angle.

In some embodiments, with reference to FIGS. 1 and 2, the first optical layer 410 can comprise a film layer, for example, the film layer can be a first sublayer 411. A refractive index of the film layer can be set greater in an appropriate range to improve a convergence degree of light and enhance a light emitting rate. Also, with reference to FIG. 6 (a), the first electrode layer 200, first sublayer 411, and second electrode layer 500 in sequence form a comparative low-high-low refractive index. By using an optical waveguide principle, light can perform movement of a multi-path in the first sublayer 411 to increase an optical path of light to combine a micro cavity effect, increase the light emitting rate and the light color purity, and the optical path of light increases while a thickness of the film layer decreases to lower a material cost.

In some embodiments, with reference to FIGS. 1, 3, and 5, a number of the at least one film layer of the first optical layer 410 is different from a number of the at least one film layer of the second optical layer 420.

According to wavelengths of different color light, different numbers of the at least one film layer are cooperated with to improve optical properties of different color light.

In some embodiments, with reference to FIGS. 1, 3, and 5, a number of the at least one film layer of the first optical layer 410 is greater than a number of the at least one film layer of the second optical layer 420, a wavelength of a color light corresponding to the first optical layer 410 is greater than a wavelength of a color light corresponding to the second optical layer 420.

To improve a micro cavity effect, increase a light emitting rate and a light color purity, color light with a longer wavelength needs to cooperate with a film layer of a longer optical path. A number of the at least one film layer is in proportion to a thickness of a film layer, and the thickness of the film layer is in proportion to the optical path. Also, increasing a number of the at least one film layer can also improve versatility of directions optically, which adapts for different optical demands.

In some embodiments, with reference to FIGS. 1, 3, and 5, a thickness of the first optical layer 410 is greater than a thickness of the second optical layer 420. A wavelength of a color light corresponding to the first optical layer 410 is greater than a wavelength of a color light corresponding to the second optical layer 420. In an appropriate film layer thickness range, color light of a longer wavelength needs to cooperate with a film layer of a longer optical path. The more a number of the at least one film layer is, the thicker a thickness of the film layer is, and the longer the optical path of the film layer is, which can improve a micro cavity effect and improve the light emitting rate and the light color purity.

In some embodiments, with reference to FIGS. 1, 3, and 5, the optical adjustment layer 400 further comprises a third optical layer 430. The third optical layer 430 corresponds to the light emitting units 310 of one light emitting color. The light emitting color of the light emitting units 310 corresponding to the first optical layer 410, the light emitting color of the light emitting units 310 corresponding to the second optical layer 420, and the light emitting color of the light emitting units 310 corresponding to the third optical layer 430 are different.

In some embodiments, a refractive index of at least one film layer of the first optical layer 410, a refractive index of at least one film layer of the second optical layer 420, and a refractive index of at least one film layer of the third optical layer 430 are different.

In some embodiments, the refractive index of at least one film layer of the first optical layer 410 is different from the refractive index of at least one film layer of the third optical layer 430, and a refractive index of at least one film layer of the second optical layer 420 is different from the refractive index of at least one film layer of the third optical layer 430.

In some embodiments, with reference to FIGS. 1 and 3, light of the light emitting units 310 of the light emitting functional layer 300 can be any one of red, green, and blue. It can be understood that the first optical layer 410 can correspond to the light emitting units 310 of red, second optical layer 420 can correspond to the light emitting units 310 of green, third optical layer 430 can correspond to the light emitting units 310 of blue.

In some embodiments, structures of the second optical layer 420 and the third optical layer 430 can refer to the structure of any of the above first optical layer 410 structure, and be adjusted according to different color light, and no repeated description is here.

In some embodiments, with reference to FIGS. 1 and 5, a thickness of the first optical layer 410 is greater than a thickness of the second optical layer 420. The thickness of the second optical layer 420 is greater than a thickness of the third optical layer 430. A number of the at least one film layer of the first optical layer 410 is greater than a number of the at least one film layer of the second optical layer 420, a number of the at least one film layer of the second optical layer 420 is greater than a number of the at least one film layer of the third optical layer 430. A wavelength of a color light corresponding to the first optical layer 410 is greater than a wavelength of a color light corresponding to the second optical layer 420. The wavelength of a color light corresponding to the second optical layer 420 is greater than a wavelength of a color light corresponding to the third optical layer 430.

In an appropriate film layer thickness range, color light of a longer wavelength needs to cooperate with a film layer of a longer optical path. The more a number of the at least one film layer is, the thicker a thickness of the film layer is, and the longer the optical path of the film layer is, which can improve a micro cavity effect and improve the light emitting rate and the light color purity.

In some embodiments, a refractive index of any layer in the optical adjustment layer 400 ranges from 1.8 to 2.5, and material thereof is one or more semiconductor oxide of IZO, ITO, AZO, IGZO. A thickness of the optical adjustment layer 400 ranges from 30 nm to 3000 nm. A number of the at least one film layer of the optical adjustment layer 400 can be 1 to 6, and preferably is 2 to 3.

In some embodiments, the display panel 100 further comprises an auxiliary adjustment layer located on one or two sides of the optical adjustment layer 400. The auxiliary adjustment layer comprises organic material. Because of a high refractive index of the optical adjustment layer 400, the organic material of the auxiliary adjustment layer can be reduced to solve material and lower a cost.

Figure 7:
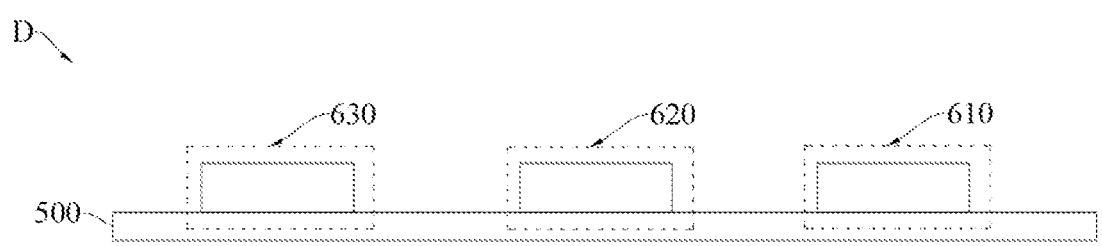
FIG. 7 is an enlarged schematic view of a region D of FIG. 1.

In some embodiments, with reference to FIGS. 1 and 7, the display panel 100 further comprises a second electrode layer 500 located on a side of the light emitting functional layer 300 away from the first electrode layer 200 and a light extraction layer 600 located on a side of the second electrode layer 500 away from the light emitting functional layer 300. The light extraction layer 600 comprises a semiconductor oxide, the light extraction layer 600 at least comprises a first extraction layer 610 and a second extraction layer 620. The first extraction layer 610 corresponds to the light emitting units 310 of a light emitting color, and the second extraction layer 620 corresponds to the light emitting units 310 of another light emitting color. a refractive index of at least one film layer of the first extraction layer 610 is different from a refractive index of at least one film layer of the second extraction layer 620.

During formation by a magnetron sputtering method, oxygen is added in a process gas. An oxygen content is adjusted and a crystalline form of the semiconductor material is adjusted to adjust a refractive index of a film layer of the light extraction layer 600 to adapt for optical demands of the light emitting units 310 of different light emitting colors, enhance optical properties, and improve a display effect of pixels of different light emitting colors.

In some embodiments, the second electrode layer 500 is a thin film including a single layer or multi-layer complex structure, and material comprises any one of Ag, Al, Pt, Mo, Ti, Cu, Mg, and a combination thereof. A thickness of the second electrode layer 500 ranges from 1 nm to 100 nm.

Figure 8:
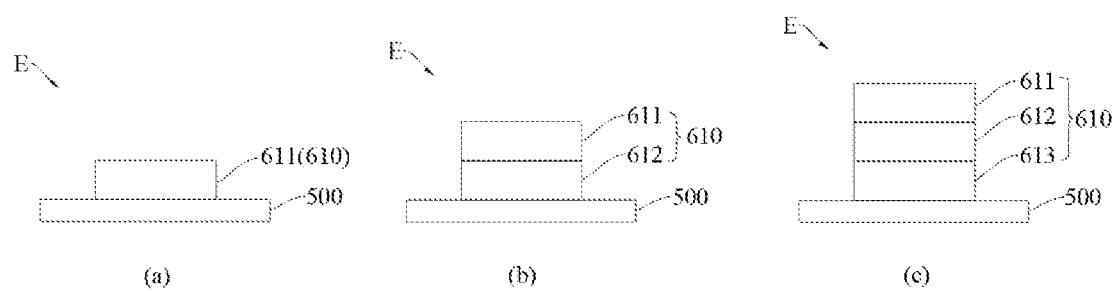
FIG. 8 is an enlarged schematic view of a region E of FIG. 1.

In some embodiments, with reference to FIG. 1 and FIG. 8 (*b*), at least one of the first extraction layer 610 at least comprises a first extraction sublayer 611 and a second extraction sublayer 612. The first extraction sublayer 611 is a film layer of the first extraction layer 610 most away from the light emitting units 310. The second extraction sublayer 612 is disposed on a surface of a side of the first extraction sublayer 611 near the second electrode layer 500. A refractive index of the first extraction sublayer 611 is greater than a refractive index of the second extraction sublayer 612.

The refractive index of the film layer of the first extraction layer 610 most away from the light emitting units 310 is greater, which can raise a light convergence effect of the first extraction layer 610 and improve a light emitting rate.

In some embodiments, with reference to FIG. 1 and FIG. 8 (*c*), the first extraction layer 610 comprises a first extraction sublayer 611, a second extraction sublayer 612, and a third extraction sublayer 630. the first extraction sublayer 611 is a film layer of the first extraction layer 610 most away from the light emitting units 310. the second extraction sublayer 612 is disposed on a surface of a side of the first extraction sublayer 611 near the second electrode layer 500. The third extraction sublayer 613 is disposed on a surface of a side of the second extraction sublayer 612 near the second electrode layer 500. A refractive index of the first extraction sublayer 611 is greater than a refractive index of the second extraction sublayer 612. A refractive index of the third extraction sublayer 613 is greater than the refractive index of the second extraction sublayer 612.

In some embodiments, with reference to FIG. 1 and FIG. 8 (*a*), the first extraction layer 610 can comprise a film layer, for example, the film layer can be a first extraction sublayer 611, and a refractive index of the film layer can be greater in an appropriate range to raise a light convergence degree to improve a light emitting rate.

In some embodiments, a refractive index of any layer in the light extraction layer 600 ranges from 1.8 to 2.5, material comprises one or more semiconductor oxides of IZO, ITO, AZO, IGZO. A thickness of the light extraction layer 600 ranges from 30 nm to 3000 nm.

In some embodiments, light extraction layer 600 further comprises an organic material comprising a molecular weight ranging from 100 to 800.

In some embodiments, a number of the at least one film layer of the light extraction layer 600 can be 1 to 6, and preferably is 2 to 3.

In some embodiments, with reference to FIGS. 1 and 7, the light extraction layer 600 further comprises a third extraction layer 630. The third extraction layer 630 corresponds to light emitting units 310 of one light emitting color. The light emitting color of the light emitting units 310 corresponds to the first extraction layer 610, the light emitting color of the light emitting units 310 corresponds to the second extraction layer 620, and the light emitting color of the light emitting units 310 corresponds to the third extraction layer 630 are different.

In some embodiments, with reference to FIGS. 1 and 7, it can be understood that the first extraction layer 610 can correspond to the light emitting units 310 of red, the second extraction layer 620 can correspond to the light emitting units 310 of green, and the third extraction layer 630 can correspond to the light emitting units 310 of blue.

In some embodiments, structures of the second extraction layer 620 and the third extraction layer 630 can be adjusted by referring to the structure of any above first extraction layer 610, according to different color light, no repeated description is here.

In some embodiments, the display panel 100 further comprises a diffusion layer located on a side of the light extraction layer 600 away from the first electrode layer 200, a refractive index of a film layer of the diffusion layer most near the light extraction layer 600 is less than a refractive index of a film layer of the light extraction layer 600 most near the diffusion layer. Using the diffusion layer has a light diffusion effect to further improve a display viewing angle of light.

In some embodiments, with reference to FIG. 1, the display panel 100 further comprises a substrate 110 and an array substrate 120 located between the substrate 110 and the first electrode layer 200.

In some embodiments, the array substrate 120 comprises an active layer located on the substrate 110, a first insulation layer located on the active layer, a gate electrode layer located on the first insulation layer, a second insulation layer located on the gate electrode layer, a source and drain electrode layer located on the second insulation layer, and a third insulation layer located on the source and drain electrode layer.

In some embodiments, the substrate 110 can be a rigid substrate 110 or a flexible substrate 110. Material of the rigid substrate 110 comprises but is not limited to glass, ceramic, metal, alloy, silicon wafer, etc. Material of the flexible substrate 110 comprises but is not limited to polyethylene, polystyrene, polyvinyl chloride, polyamide, polyimide, polyethylene terephthalate, polybutylene terephthalate, and homologues of the aforementioned materials, isomer, and on the basis thereof a polymer of hydrocarbyl, aromatic, or heterocyclic group increasing a number of carbon (C) by 1 to 16, a number of nitrogen (N) by 1 to 9, a number of oxygen (O) by 1 to 5.

The present invention, during magnetron sputtering film formation, adjusts oxygen content in a process gas, adjusts a crystalline form of semiconductor material, and adjusts a refractive index of a film layer in an optical adjustment layer to adapt for optical demands of light emitting units of different light emitting colors to improve display effects of pixels of different light emitting colors.

Figure 9:
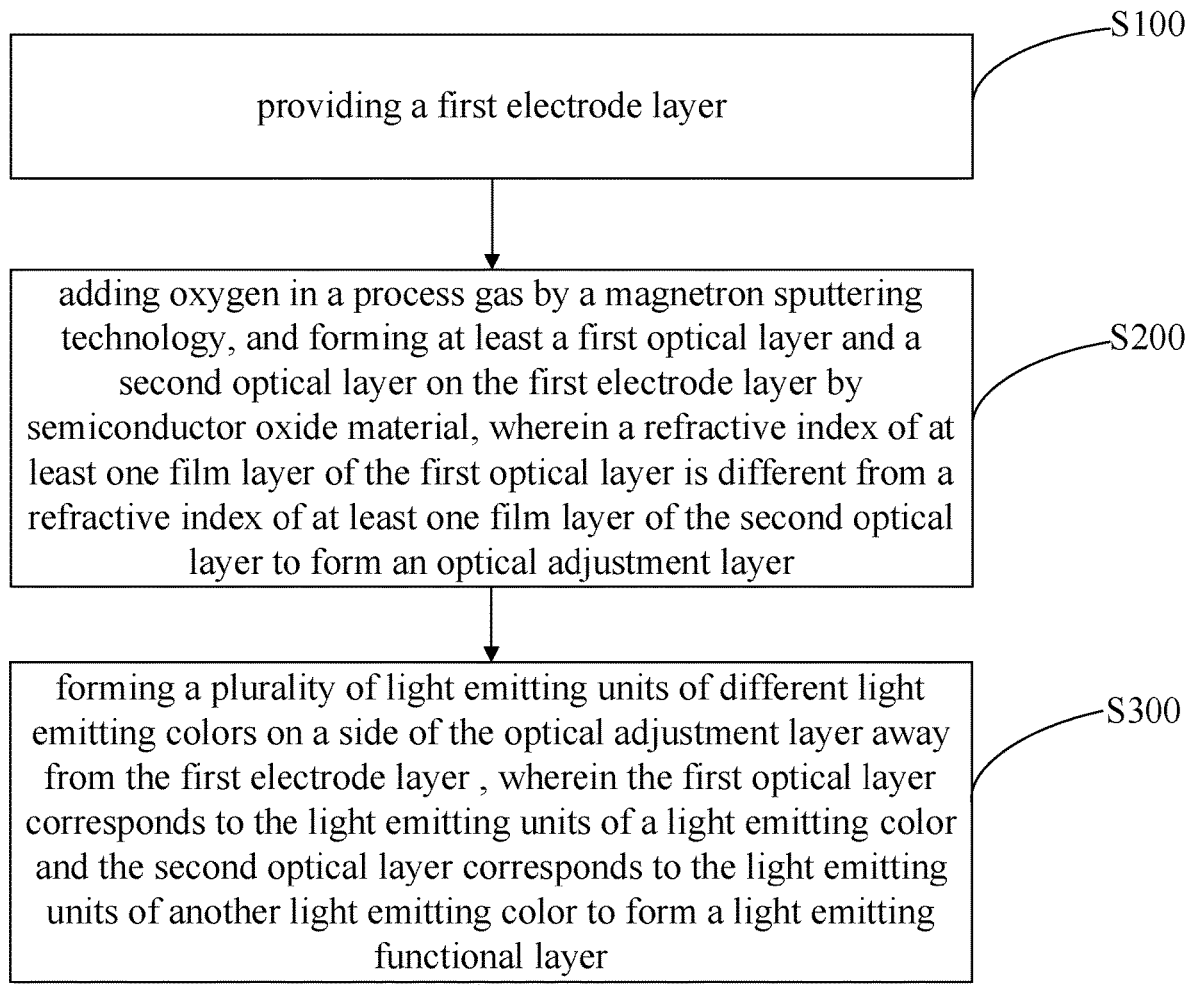
FIG. 9 is a flowchart of a method for manufacturing a display panel provided by the embodiment of the present invention.

With reference to FIG. 9, the embodiment of the present invention also provides a method for manufacturing a display panel 100, comprising:

a step S100 comprising providing a first electrode layer 200;

a step S200 comprising, adding oxygen in a process gas by a magnetron sputtering technology, and forming at least a first optical layer 410 and a second optical layer 420 on the first electrode layer 200 by semiconductor oxide material, wherein a refractive index of at least one film layer of the first optical layer 410 is different from a refractive index of at least one film layer of the second optical layer 420 to form an optical adjustment layer 400; and a step S300 comprising forming a plurality of light emitting units 310 of different light emitting colors on a side of the optical adjustment layer 400 away from the first electrode layer 200, wherein the first optical layer 410 corresponds to the light emitting units 310 of a light emitting color and the second optical layer 420 corresponds to the light emitting units 310 of another light emitting color to form a light emitting functional layer 300.

The present invention, during magnetron sputtering film formation, adjusts oxygen content in a process gas, adjusts a crystalline form of semiconductor material, and adjusts a refractive index of a film layer in an optical adjustment layer to adapt for optical demands of light emitting units of different light emitting colors to improve display effects of pixels of different light emitting colors.

A technical solution of the present invention will be described with specific embodiments.

Figure 10A:
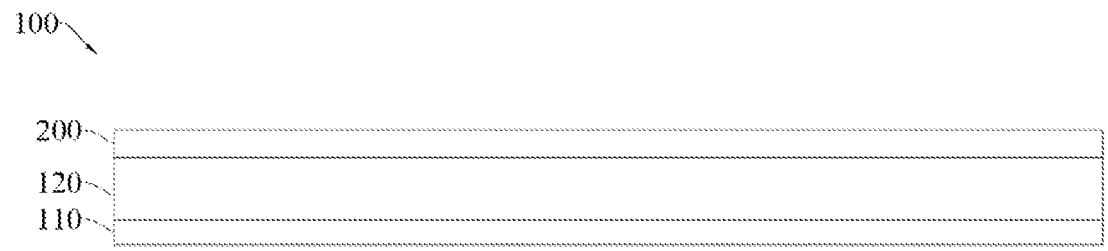
FIGS. 10A to 10C are schematic views of a flowchart of the method for manufacturing a display panel provided by the embodiment of the present invention.

In the present embodiment, the method for manufacturing the display panel 100, comprises steps as follows:

A step S100 comprises providing a first electrode layer 200, with reference to FIG. 10A.

In some embodiments, the first electrode layer 200 is located away from a light exiting side. Material of the first electrode layer 200 has a reflection function and a conduction function. The first electrode layer 200 comprises any one of Ag, Al, Pt, Mo, Ti, Cu, Mg, and a combination thereof. A thickness of the first electrode layer 200 ranges from 100 nm to 1000 nm.

Figure 10B:
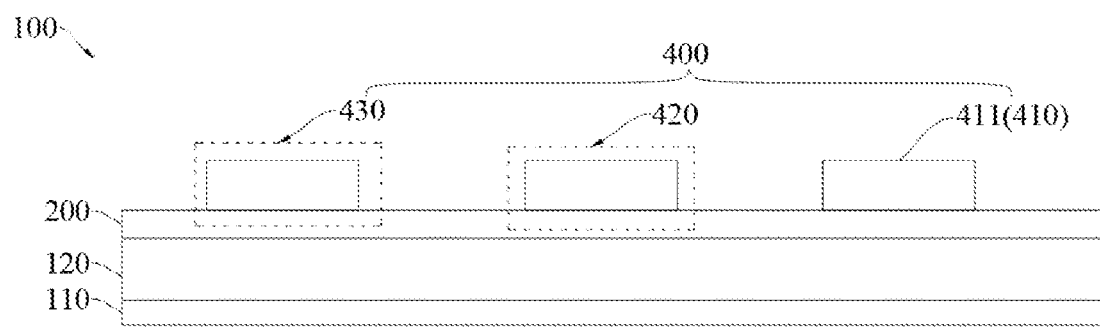

A step S200 comprises, adding oxygen in a process gas by a magnetron sputtering technology, and forming at least a first optical layer 410 and a second optical layer 420 on the first electrode layer 200 by semiconductor oxide material, wherein a refractive index of at least one film layer of the first optical layer 410 is different from a refractive index of at least one film layer of the second optical layer 420 to form an optical adjustment layer 400, with reference to FIG. 10B.

In some embodiments, the step S200 comprises a step as follows:

A step S210 comprises adding oxygen in a process gas by a magnetron sputtering technology forming at least a first optical layer 410, a second optical layer 420, and a third optical layer 430 on the first electrode layer 200 by semiconductor oxide material, wherein a refractive index of at least one film layer of the first optical layer 410, a refractive index of at least one film layer of the second optical layer 420, and a refractive index of at least one film layer of the third optical layer 430 are different to form an optical adjustment layer 400.

In some embodiments, a refractive index of at least one film layer of the first optical layer 410 is different from a refractive index of at least one film layer of the third optical layer 430. A refractive index of at least one film layer of the second optical layer 420 is different from the refractive index of at least one film layer of the third optical layer 430.

In some embodiments, with reference to FIGS. 1, 3, and 5, the optical adjustment layer 400 further comprises a third optical layer 430. The third optical layer 430 corresponds to the light emitting units 310 of one light emitting color. The light emitting color of the light emitting units 310 corresponding to the first optical layer 410, the light emitting color of the light emitting units 310 corresponding to the second optical layer 420, and the light emitting color of the light emitting units 310 corresponding to the third optical layer 430 are different.

In some embodiments, with reference to FIGS. 1 and 5, a thickness of the first optical layer 410 is greater than a thickness of the second optical layer 420, a thickness of the second optical layer 420 is greater than a thickness of the third optical layer 430. a number of the at least one film layer of the first optical layer 410 is greater than a number of the at least one film layer of the second optical layer 420, a number of the at least one film layer of the second optical layer 420 is greater than a number of the at least one film layer of the third optical layer 430. A wavelength of a color light corresponding to the first optical layer 410 is greater than a wavelength of a color light corresponding to the second optical layer 420. The wavelength of a color light corresponding to the second optical layer 420 is greater than a wavelength of a color light corresponding to the third optical layer 430.

In some embodiments, with reference to FIGS. 1 and 3, light of the light emitting units 310 of the light emitting functional layer 300 can be any one of red, green, and blue. It can be understood that the first optical layer 410 can correspond to the light emitting units 310 of red, second optical layer 420 can correspond to the light emitting units 310 of green, third optical layer 430 can correspond to the light emitting units 310 of blue.

In some embodiments, structures of the second optical layer 420 and the third optical layer 430 can refer to the structure of any of the above first optical layer 410, and be adjusted according to different color light, and no repeated description is here.

In some embodiments, the process gas further comprises an inert gas or/and nitrogen, and the inert gas can be argon. The oxygen content in the process gas is adjusted, the crystalline form of the semiconductor material is adjusted to adjust the value of the refractive index of the thin film such that the refractive index of the thin film can be adjusted without changing a target or change and increase a magnetron sputtering apparatus, which lowers costs of material and apparatuses. A proportion of the oxygen in the process gas ranges from 0% to 50%, and preferably ranges from 0.01% to 20%. The refractive index of the thin film ranges from 1.8 to 2.5.

Figure 10C:
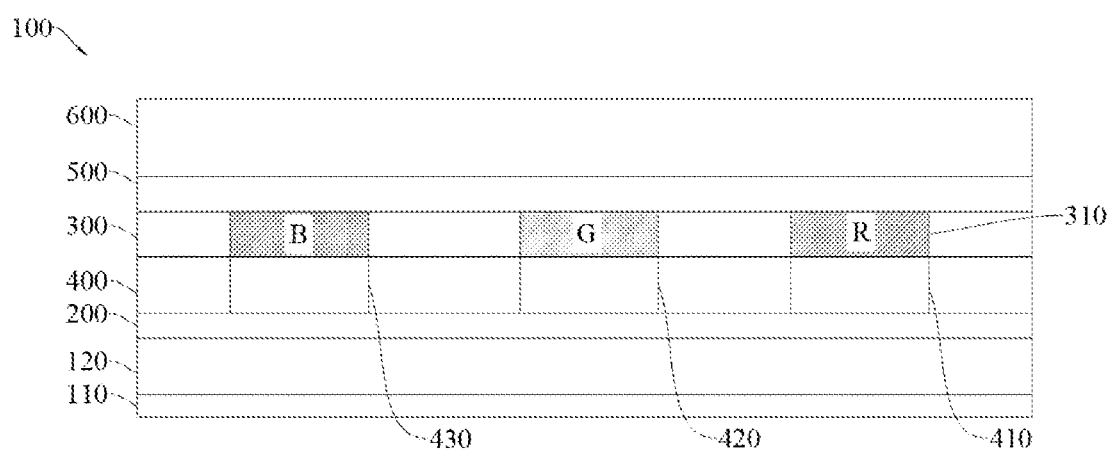

The step S300 comprising forming a plurality of light emitting units 310 of different light emitting colors on a side of the optical adjustment layer 400 away from the first electrode layer 200, wherein the first optical layer 410 corresponds to the light emitting units 310 of a light emitting color, the second optical layer 420 corresponds to the light emitting units 310 of another light emitting color to form the light emitting functional layer 300, as shown in FIG. 10C.

In some embodiments, with reference to FIGS. 1 and 5, the optical adjustment layer 400 further comprises a third optical layer 430. The third optical layer 430 corresponds to the light emitting units 310 of one light emitting color. The light emitting color of the light emitting units 310 corresponding to the first optical layer 410, the light emitting color of the light emitting units 310 corresponding to the second optical layer 420, and the light emitting color of the light emitting units 310 corresponding to the third optical layer 430 are different.

In some embodiments, with reference to FIGS. 1 and 5, light of the light emitting units 310 of the light emitting functional layer 300 can be any one of red, green, and blue. It can be understood that the first optical layer 410 can correspond to the light emitting units 310 of red, second optical layer 420 can correspond to the light emitting units 310 of green, third optical layer 430 can correspond to the light emitting units 310 of blue.

In some embodiments, the method for manufacturing the display panel 100 further comprises steps as follows:

A step S400 comprises forming a second electrode layer 500 on a side of the light emitting functional layer 300 away from the first electrode layer 200, as shown in FIG. 1.

In some embodiments, the second electrode layer 500 is a thin film including a single layer or multi-layer complex structure, and material comprises any one of Ag, Al, Pt, Mo, Ti, Cu, Mg, and a combination thereof. A thickness of the second electrode layer 500 ranges from 1 nm to 100 nm.

A step S500 comprises, adding oxygen in a process gas by a magnetron sputtering technology, forming at least a first extraction layer 610 and a second extraction layer 620 on the second electrode layer 500 by semiconductor oxide material, wherein a refractive index of at least one film layer of the first extraction layer 610 is different from a refractive index of at least one film layer of the second extraction layer 620 to form a light extraction layer 600, as shown in FIG. 1.

In some embodiments, with reference to FIGS. 1 and 7, the light extraction layer 600 further comprises a third extraction layer 630. The third extraction layer 630 corresponds to light emitting units 310 of one light emitting color. The light emitting color of the light emitting units 310 corresponds to the first extraction layer 610, the light emitting color of the light emitting units 310 corresponds to the second extraction layer 620, and the light emitting color of the light emitting units 310 corresponds to the third extraction layer 630 are different.

In some embodiments, with reference to FIGS. 1 and 7, it can be understood that the first extraction layer 610 can correspond to the light emitting units 310 of red, the second extraction layer 620 can correspond to the light emitting units 310 of green, and the third extraction layer 630 can correspond to the light emitting units 310 of blue.

The present invention, during magnetron sputtering film formation, adjusts oxygen content in a process gas, adjusts a crystalline form of semiconductor material, and adjusts a refractive index of a film layer in an optical adjustment layer to adapt for optical demands of light emitting units of different light emitting colors to improve display effects of pixels of different light emitting colors.

Figure 11:
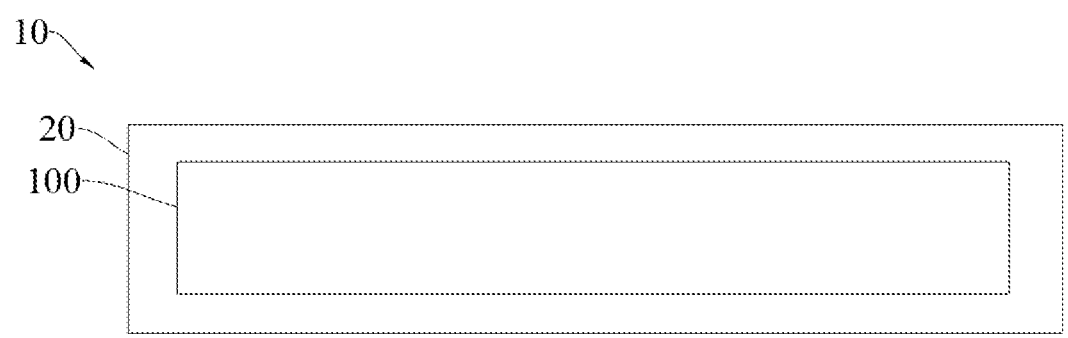
FIG. 11 is a schematic structural view of a display device provided by the embodiment of the present invention.

With reference to FIG. 11, the embodiment of the present invention further provides a display device 10 comprising any of the above display panels 100 and device main body 20, the device main body 20 is assembled with the display panel 100 integrally.

A specific structure of the display panel 100 please refer to any embodiments and figures of the above display panel 100, and no repeated description is here.

In the present embodiment, the device main body 20 can comprise a middle frame, a sealant frame, etc. The display device 10 can be a display terminal such as a cell phone, a tablet, a television, and no limit is here.

The embodiment of the present invention discloses a display panel and a manufacturing method thereof. The display panel includes a substrate, a light emitting functional layer, a first electrode layer, and an optical adjustment layer. The light emitting functional layer includes a plurality of light emitting units of different light emitting colors. The optical adjustment layer includes a semiconductor oxide. The optical adjustment layer at least comprises a first optical layer and a second optical layer. A light emitting color of the light emitting units corresponding to the first optical layer is different from a light emitting color of the light emitting units corresponding to the second optical layer. A refractive index of at least one film layer of the first optical layer is different from a refractive index of at least one film layer of the second optical layer. The present invention, during magnetron sputtering film formation, adjusts oxygen content in a process gas, adjusts a crystalline form of semiconductor material, and adjusts a refractive index of a film layer in an optical adjustment layer to adapt for optical demands of light emitting units of different light emitting colors to improve display effects of pixels of different light emitting colors.

The display panel and the manufacturing method thereof provided by the embodiment of the present invention are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. A display panel, comprising:
a substrate;
a first electrode layer located on the substrate;
an optical adjustment layer located on the first electrode layer, wherein the optical adjustment layer comprises a semiconductor oxide;
a light emitting functional layer located on the optical adjustment layer, wherein the light emitting functional layer comprises a plurality of light emitting units of different light emitting colors;
wherein the optical adjustment layer comprises a first optical layer and a second optical layer, the first optical layer corresponds to the light emitting units of a light emitting color, the second optical layer corresponds to the light emitting units of another light emitting color, and a refractive index of at least one film layer of the first optical layer is different from a refractive index of at least one film layer of the second optical layer;
wherein at least one of the first optical layer comprises a first sublayer and a second sublayer disposed adjacent to each other, and the second sublayer is located between the first sublayer and the light emitting functional layer;
wherein a refractive index of the second sublayer is greater than a refractive index of the first sublayer;
wherein the light emitting functional layer comprises a first organic sublayer, located on a surface of a side of the second sublayer away from the substrate, and the refractive index of the second sublayer is greater than a refractive index of the first organic sublayer.

2. The display panel according to claim 1, wherein a number of the at least one film layer of the first optical layer is greater than a number of the at least one film layer of the second optical layer, and a wavelength of a color light corresponding to the first optical layer is greater than a wavelength of a color light corresponding to the second optical layer.

3. The display panel according to claim 2, wherein a thickness of the first optical layer is greater than a thickness of the second optical layer.

4. The display panel according to claim 1, further comprising:
a second electrode layer located on a side of the light emitting functional layer away from the first electrode layer; and
a light extraction layer located on a side of the second electrode layer away from the light emitting functional layer, wherein the light extraction layer comprises a semiconductor oxide;
wherein the light extraction layer comprises a first extraction layer corresponding to the light emitting units of a light emitting color and a second extraction layer corresponding to the light emitting units of another light emitting color, and a refractive index of at least one film layer of the first extraction layer is different from a refractive index of at least one film layer of the second extraction layer.

5. The display panel according to claim 4, wherein the first extraction layer comprises a first extraction sublayer and a second extraction sublayer, the first extraction sublayer is a film layer of the first extraction layer most away from the light emitting units, and the second extraction sublayer is disposed on a surface of a side of the first extraction sublayer near the second electrode layer; and
a refractive index of the first extraction sublayer is greater than a refractive index of the second extraction sublayer.

6. The display panel according to claim 1, wherein the optical adjustment layer further comprises a third optical layer; the refractive index of at least one film layer of the first optical layer, the refractive index of at least one film layer of the second optical layer, and a refractive index of at least one film layer of the third optical layer are different; and light emitting colors of the light emitting units corresponding to the first optical layer, the second optical layer, and the third optical layer are different.

7. The display panel according to claim 6, wherein
a thickness of the first optical layer is greater than a thickness of the second optical layer, a thickness of the second optical layer is greater than a thickness of the third optical layer;
a number of the at least one film layer of the first optical layer is greater than a number of the at least one film layer of the second optical layer, and the number of the at least one film layer of the second optical layer is greater than a number of the at least one film layer of the third optical layer; and
a wavelength of a color light corresponding to the first optical layer is greater than a wavelength of a color light corresponding to the second optical layer, and a wavelength of a color light corresponding to the second optical layer is greater than a wavelength of a color light corresponding to the third optical layer.

8. A method for manufacturing a display panel, comprising:
providing a first electrode layer;
adding oxygen in a process gas by a magnetron sputtering technology, and forming at least a first optical layer and a second optical layer on the first electrode layer by semiconductor oxide material, wherein a refractive index of at least one film layer of the first optical layer is different from a refractive index of at least one film layer of the second optical layer to form an optical adjustment layer; and forming a plurality of light emitting units including different light emitting colors on a side of the optical adjustment layer away from the first electrode layer, wherein the first optical layer corresponds to the light emitting units of a light emitting color and the second optical layer corresponds to the light emitting units of another light emitting color to form a light emitting functional layer.

9. A display panel, comprising:
a substrate;
a first electrode layer located on the substrate;
an optical adjustment layer located on the first electrode layer, wherein the optical adjustment layer comprises a semiconductor oxide;
a light emitting functional layer located on the optical adjustment layer, wherein the light emitting functional layer comprises a plurality of light emitting units of different light emitting colors;
wherein the optical adjustment layer comprises a first optical layer and a second optical layer, the first optical layer corresponds to the light emitting units of a light emitting color, the second optical layer corresponds to the light emitting units of another light emitting color, and a refractive index of at least one film layer of the first optical layer is different from a refractive index of at least one film layer of the second optical layer;
wherein the optical adjustment layer further comprises a third optical layer; the refractive index of at least one film layer of the first optical layer, the refractive index of at least one film layer of the second optical layer, and a refractive index of at least one film layer of the third optical layer are different; and light emitting colors of the light emitting units corresponding to the first optical layer, the second optical layer, and the third optical layer are different.

10. The display panel according to claim 9, wherein at least one of the first optical layer comprises a first sublayer and a second sublayer disposed adjacent to each other, and the second sublayer is located between the first sublayer and the light emitting functional layer; and
a refractive index of the second sublayer is greater than a refractive index of the first sublayer;
wherein at least one of the first optical layer comprises a first sublayer, a second sublayer located on a side of the first sublayer near the light emitting functional layer, and a third sublayer located between the second sublayer and the light emitting functional layer; and the refractive index of the second sublayer is less than the refractive index of the first sublayer, and the refractive index of the second sublayer is less than the refractive index of the third sublayer;
wherein the light emitting functional layer comprises a first organic sublayer located on a surface of a side of the third sublayer away from the substrate, and the refractive index of the third sublayer is greater than a refractive index of the first organic sublayer;

wherein a number of the at least one film layer of the first optical layer is greater than a number of the at least one film layer of the second optical layer, and a wavelength of a color light corresponding to the first optical layer is greater than a wavelength of a color light corresponding to the second optical layer.

11. The display panel according to claim 9, wherein a thickness of the first optical layer is greater than a thickness of the second optical layer.

12. The display panel according to claim 9, further comprising:
a second electrode layer located on a side of the light emitting functional layer away from the first electrode layer; and
a light extraction layer located on a side of the second electrode layer away from the light emitting functional layer, wherein the light extraction layer comprises a semiconductor oxide;
wherein the light extraction layer comprises a first extraction layer corresponding to the light emitting units of a light emitting color and a second extraction layer corresponding to the light emitting units of another light emitting color, and a refractive index of at least one film layer of the first extraction layer is different from a refractive index of at least one film layer of the second extraction layer.

13. The display panel according to claim 12, wherein the first extraction layer comprises a first extraction sublayer and a second extraction sublayer, the first extraction sublayer is a film layer of the first extraction layer most away from the light emitting units, and the second extraction sublayer is disposed on a surface of a side of the first extraction sublayer near the second electrode layer; and
a refractive index of the first extraction sublayer is greater than a refractive index of the second extraction sublayer.

14. The display panel according to claim 9, wherein
a thickness of the first optical layer is greater than a thickness of the second optical layer, a thickness of the second optical layer is greater than a thickness of the third optical layer;
a number of the at least one film layer of the first optical layer is greater than a number of the at least one film layer of the second optical layer, and the number of the at least one film layer of the second optical layer is greater than a number of the at least one film layer of the third optical layer; and
a wavelength of a color light corresponding to the first optical layer is greater than a wavelength of a color light corresponding to the second optical layer, and a wavelength of a color light corresponding to the second optical layer is greater than a wavelength of a color light corresponding to the third optical layer.

* * * * *